Jan. 19, 1960 H. A. REISE 2,922,037

QUICK RECOVERY CIRCUIT FOR BLOCKING OSCILLATORS

Filed Nov. 17, 1955

INVENTOR
H. A. REISE
BY W L Keefauver
ATTORNEY

United States Patent Office 2,922,037

Patented Jan. 19, 1960

2,922,037

QUICK RECOVERY CIRCUIT FOR BLOCKING OSCILLATORS

Herman A. Reise, West Orange, N.J., assignor to Bell Telephone Laboratories, Incorporated, New York, N.Y., a corporation of New York Application November 17, 1955, Serial No. 547,418

4 Claims. (Cl. 250—27)

This invention relates to oscillation generators and more particularly to blocking oscillators for generating closely spaced pulses.

A blocking oscillator generates steep sided pulses of short duration; and it may include, for example, one electron discharge device, and a grid blocking capacitor and a grid leak resistor to control the pulse repetition frequency. The blocking oscillator is so named because a charge accumulates on the blocking capacitor which cuts the oscillator off after one or more cycles of conduction. Blocking oscillators generally fall into one of two categories, namely, single-swing oscillators in which the discharge device is cut off at, or before, the completion of one cycle, and self-pulsing oscillators in which the discharge device is cut off after a predetermined number of cycles greater than one. Within each of the above categories the blocking oscillator may be made either triggered or free-running by an appropriate arrangement of the oscillator bias voltages.

Following each oscillator conduction interval, at least a part of the accumulated charge on the blocking capacitor is dissipated in the grid leak resistor so the time constant of the blocking capacitor and the grid leak resistor controls the oscillator recovery time, i.e., the time required for the charge on the blocking capacitor to be reduced sufficiently to permit the oscillator to conduct again. The grid leak resistor must, therefore, be small enough to permit the desired oscillator pulse repetition frequency but large enough to provide a suitable input impedance for the discharge device.

Blocking oscillator recovery time and methods for reducing it have been studied previously. As a result, diode dischargers have been employed to reduce the impedance of the discharge path for the blocking capacitor. The circuits which are currently known for reducing recovery time by means of a diode discharger have the diode so connected that it can conduct during the charging interval of the blocking capacitor as well as during the recovery interval. This, of course, increases the time necessary for the blocking capacitor to become charged.

Triode dischargers have also been employed, but in such circuits it is necessary to employ a delay line in conjunction with the triode to control its time of conduction. This type of discharger, however, can provide a discharge path only during an interval which is equal to the duration of one oscillator output pulse. The conducting impedance of the triode which constitutes the discharge path is considerably greater than the conducting impedance of a diode so the discharge path still has a substantial time constant.

It is therefore one object of this invention to enable a blocking oscillator to generate closely spaced pulses.

It is a further object of the invention to reduce the minimum recovery time that must be allowed to discharge an oscillator blocking capacitor.

In an illustrative embodiment of this invention, a triggered, single-swing, blocking oscillator is provided with a triode vacuum tube and a feedback transformer having its primary winding connected in series with the anode of the vacuum tube and having its secondary winding connected in series with a blocking capacitor between the control grid and the cathode of the vacuum tube. A diode is connected in parallel with the series combination of the blocking capacitor and the secondary winding to provide a low impedance discharge path for the blocking capacitor. The diode is so poled with respect to the secondary winding that it conducts in the interval between oscillator pulses and not during the oscillator output pulse interval.

In another embodiment of the invention the blocking capacitor is replaced by a series of smaller capacitors connected as shunt branches of a delay line to provide accurate pulse length definition.

One feature of this invention is that while the diode discharger provides a low impedance discharge path for the blocking capacitor during the entire interval between output pulses, it is ineffective in the oscillator circuit during the oscillator output pulse interval to impair the output pulse rise time.

Another feature of the invention is that oscillator recovery time is reduced by the ratio of the diode conducting resistance to the resistance of the capacitor discharge path without a diode discharger. For example, the recovery time of a particular blocking oscillator can be reduced from 100 microseconds to ½ a microsecond by employing the principle of the present invention.

Additional objects and advantages of this invention will be apparent from the following detailed description taken in connection with the attached drawing in which.

Figure 1:
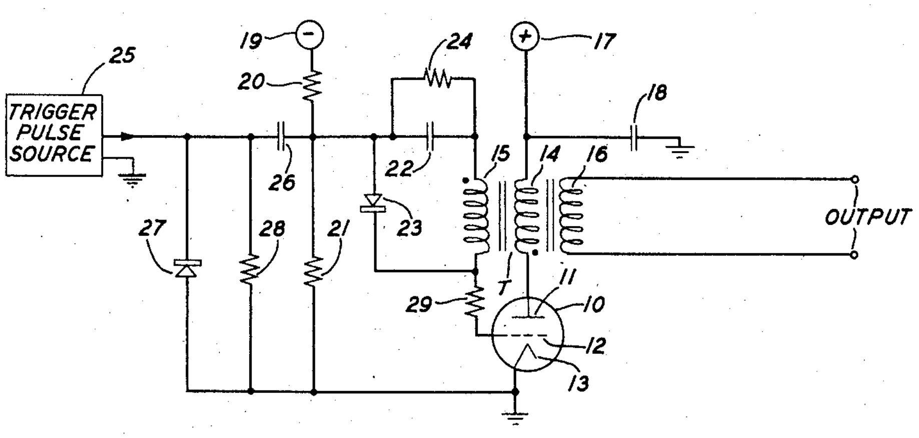
Fig. 1 is a schematic circuit diagram of one embodiment of the invention.

The blocking oscillator circuit illustrated in Fig. 1 is a triggered, single-swing, blocking oscillator, and it includes an electron discharge tube 10 having an anode 11, a control grid 12 and a cathode 13. Mutual inductance feedback from anode 11 to grid 12 is provided by a transformer 7 having a primary winding 14 connected to anode 11 and a secondary winding 15 connected to grid 12. The transformer T is also provided with a secondary winding 16 couples energy from the anode circuit to the oscillator output. The dots adjacent the ends of windings 14 and 15 indicate terminals of like instantaneous polarity. Thus when the potential at the lower, or anode, end of winding 14 is negative with respect to the upper end thereof, the potential at the lower end of winding 15 is positive with respect to the upper end thereof.

A source 17 supplies oscillator anode potential via winding 14, and the capacitor 18 bypasses alternating current energy to ground to prevent its entry into source 17. Another source 19 and its associated bleeder resistances 20 and 21, provide direct current bias for grid 12. The sources 17 and 19 are schematically represented as circled plus and minus signs, respectively, it being understood that each circle represents a source of direct potential having a terminal of the indicated polarity connected to the circles designated by the reference characters 17 and 19, respectively, and having the other terminal thereof connected to ground.

A blocking capacitor 22 is connected in series with secondary winding 15 in the grid current path for grid 12. A diode discharger 23 is connected in parallel with capacitor 22 and winding 15. Diode 23 is represented in a conventional manner as a triangular portion for the anode and a rectangular portion for the cathode, with the two portions being combined to represent an arrowhead designating the direction of electric current flow. Diode 23 is so poled with respect to capacitor 22 and secondary winding 15 that it can conduct only when the net instantaneous voltage across winding 15 and capacitor 22 is such as to tend to make grid 12 negative. The resistor 24 connected in parallel with capacitor 22 provides a direct current path around capacitor 22 to grid 12 from bias source 19.

Positive triggering pulses from the source 25 are applied to the junction point of capacitor 22 and diode 23 through the coupling capacitor 26. Diode 27 is poled to provide a low impedance path for grid current around resistor 28 during the oscillator conduction interval when grid 12 is positive. The resistor 28 provides a leakage path to ground for any charge which is accumulated on the left hand plate of capacitor 26 during oscillator operation. Resistor 28 also fixes the oscillator input impedance presented to trigger pulse source 25; this is necessary since reverse impedances may vary widely among diodes. Grid current magnitude is limited by a resistor 29 connected in series with grid 12.

In the absence of a triggering pulse from pulse source 25, grid 12 is biased negatively with respect to cathode 13 by bias source 19. A positive trigger pulse from source 25 is applied to grid 12 through capacitor 26 and diode 23 to bias grid 12 positively with respect to cathode 13 and thereby initiate oscillator operation. Triode 10 begins to conduct causing the lower end of primary winding 14 to become negative with respect to the upper end thereof. The induced voltage in secondary winding 15 drives grid 12 more positive and this regenerative action causes the lower end of winding 14 to become still more negative. Capacitor 22 tends to become charged with its left plate positive through a charging current path including coupling capacitor 26, diode 27, ground, cathode 13, grid 12, resistor 29 and secondary winding 15. Regenerative action can be halted either by transformer saturation or by the blocking action of capacitor 22. The subsequent discussion assumes the latter case for the purpose of illustration.

The potential across the terminals of capacitor 22 opposes the induced voltage in winding 15. When the potential across capacitor 22 has increased sufficiently with respect to the voltage across secondary winding 15 to reduce grid current, plate current also starts to decrease. The regenerative action outlined above now continues in reverse until triode 10 is cut off. As the field about secondary winding 15 collapses the net potential appearing across winding 15 and capacitor 22 places a forward bias on diode 23, and capacitor 22 discharges through diode 23 and winding 15. After blocking capacitor 22 has been discharged, grid 12 is once more negatively biased with respect to cathode 13 by source 19.

It can be readily seen that if diode 23 were not in the circuit capacitor 22 would have to discharge through resistor 24. Thus the improvement in recovery time for the oscillator illustrated is essentially that represented by the ratio of the resistance of resistor 24 to the resistance of the discharge path through diode 23 and winding 15.

Figure 2:
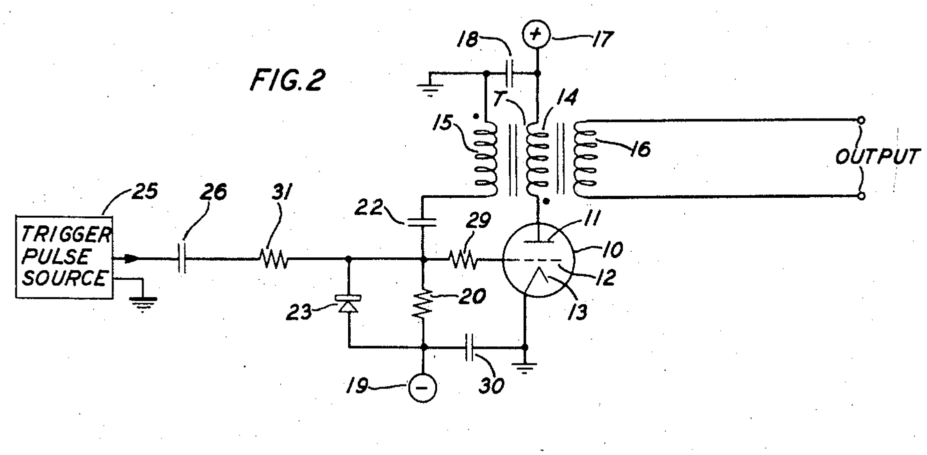
Figs. 2 and 3 are modifications of the circuit of Fig. 1.

The circuit of Fig. 2 is a triggered, single-swing, blocking oscillator similar to that of Fig. 1 and corresponding elements have been designated with like numerals. A resistor 31 provides a high impedance looking into the output of trigger pulse source 25 so that portion of the circuit has substantially no influence as an impedance in the oscillator operation. Capacitor 30 is an alternating current bypass for source 19.

In this case trigger pulses are applied directly to grid 12 through resistors 29 and 31 and through capacitor 26. Thus the feedback circuit, including winding 15 and blocking capacitor 22, and diode discharger 23, are essentially independent of the triggering pulse circuit. During the conduction interval of triode 10, blocking capacitor 22 charges through the loop including secondary winding 15, ground, cathode 13, grid 12 and resistor 29. Diode 23 is unable to conduct while capacitor 22 is charging since the net potential applied to it by the induced voltage on secondary winding 15, the instantaneous potential on capacitor 22, and the bias source 19 constitutes a reverse bias. After triode 10 has been cut off capacitor 22 begins to discharge through a path including secondary winding 15, ground, capacitor 30, and diode 23. The capacity of bypass capacitor 30 is much greater than that of capacitor 22 so capacitor 30 presents to the above-mentioned discharge path of capacitor 22 a very small reactance compared to the reactance of capacitor 22. Capacitor 30, therefore, has practically no effect upon the pulse length or recovery time. The order of magnitude of improvement in recovery time of the oscillator is essentially the same as that for Fig. 1.

Figure 3:
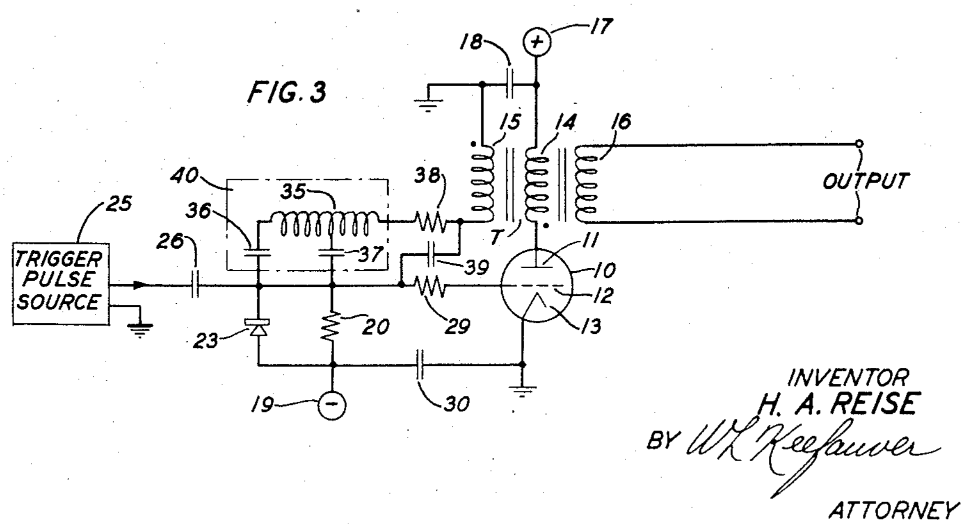

The circuit of Fig. 3 is a triggered, single-swing blocking oscillator similar to that of Fig. 2 except that blocking capacitor 22 has been replaced by a pulse forming network 40 which includes an inductor 35 and capacitors 36 and 37. A resistor 38 is connected in series with inductor 35 to match the impedance of pulse forming network 40 with the resistances of the charging and discharging paths for capacitors 36 and 37. The pulse forming network permits more accurate pulse length definition in the oscillator than is normally possible with just a blocking capacitor.

When using a pulse forming network the circuit resistance through which the capacitors of the network are charged and discharged should be essentially equal to the impedance of the pulse forming network to prevent energy reflections that would interfere with succeeding triggering pulses. The prevention of energy reflections is particularly important in circuits which must generate closely spaced pulses. In Fig. 3 the charging circuit is composed of resistor 38 and winding 15 in series with the resistor 20 in parallel with the series combination of resistor 29 and the grid to cathode impedance of tube 10. The discharging circuit is composed of resistor 38 and winding 15 in series with the combination of diode 23 in parallel with resistor 20. Diode 23 provides a low impedance shunt path around resistor 20 for the discharge path corresponding to the low grid to cathode impedance of tube 10 in the charge path. Thus resistor 38, which is in both the charging and discharging paths of the capacitors 36 and 37, is part of the total terminating impedance for pulse forming network 40; and its resistance is chosen to match the resistances of the charging and discharging paths to the impedance of the pulse forming network 40.

A small starting capacitor 39 can be connected from the lower end of winding 15 to the left end of resistor 29. This tends to shorten pulse rise time which otherwise would be somewhat extended by the pulse forming network.

Although this invention has been described with reference to particular embodiments thereof it should not be deemed limited to these arrangements since many other embodiments and modifications will be apparent to those skilled in the art without departing from either the spirit or the scope of the invention.

What is claimed is:

1. A blocking oscillator comprising an electron discharge tube having anode, cathode and grid electrodes, a transformer having a primary winding and a secondary winding, a source of potential, an anode to cathode circuit including said primary winding and said source, a pulse forming network, a grid-cathode circuit including said secondary winding and said pulse forming network, a source of trigger pulses connected to said grid electrode, a diode, and means connecting said diode between said grid and said cathode, said diode being poled for forward conduction of current from said cathode to said grid.

2. In combination, an electron discharge device having anode, cathode and grid electrodes, a source of trigger pulses, a coupling capacitor for connecting said pulse source to said grid electrode, a transformer comprising a primary winding, a first secondary winding, and a second secondary winding, means for connecting said primary winding between said cathode and anode electrodes, oscillator output utilization means connected to said first secondary winding, a source of bias potential, resistance means for connecting said bias source between said grid and said cathode, a bypass capacitor connected in parallel with said bias source, a diode, alternating current circuit means including said bypass capacitor for connecting said diode between said grid and said cathode, said diode being poled for forward conduction of current from said cathode to said grid, a pulse forming network comprising a series inductance and a plurality of capacitors connected between discrete points along said inductance and a common terminal, means for connecting said pulse forming network common terminal to said grid electrode, and means including said transformer second secondary winding for connecting one terminal of said inductance to said cathode electrode.

3. A blocking oscillator as in claim 2 having a low impedance starting capacitor connected between said one inductance terminal and said grid electrode.

4. A blocking oscillator as in claim 2 comprising a starting capacitor connected between said one inductance terminal and said grid electrode, said means for connecting one terminal of said inductance to said cathode electrode also including a matching resistor connected in series between said pulse forming network and said second secondary winding, a discharging current path for said pulse forming network capacitors, said discharging current path including said matching resistor, said second secondary winding, and said diode, and a charging current path for said pulse forming network capacitors including said matching resistor, said second secondary winding, and said grid and cathode electrodes, the resistance of said matching resistor being such as to match the impedance of said pulse forming network to the resistance of said charging and discharging current paths.

References Cited in the file of this patent

UNITED STATES PATENTS

| | | |
|---|---|---|
| 1,839,481 | Holst et al. | Jan. 5, 1932 |
| 2,250,706 | Geiger | July 29, 1941 |
| 2,573,284 | Shaw | Oct. 30, 1951 |
| 2,582,697 | Hepp | Jan. 15, 1952 |
| 2,740,047 | Bayliss | Mar. 27, 1956 |

FOREIGN PATENTS

| | | |
|---|---|---|
| 442,938 | Great Britain | Feb. 18, 1936 |
| 630,219 | Great Britain | Oct. 7, 1949 |